(12) United States Patent
Ekwall et al.

(10) Patent No.: US 9,984,953 B2
(45) Date of Patent: May 29, 2018

(54) SEMICONDUCTOR ASSEMBLY HAVING A PRESS PACK STACK

(71) Applicant: ABB Technology Ltd, Zürich (CH)

(72) Inventors: Olle Ekwall, Ludvika (SE); Erik Doré, Ludvika (SE); Franc Dugal, Benglen (CH); Raffael Schnell, Seon (CH)

(73) Assignee: ABB SCHWEIZ AG, Baden (CH)

( * ) Notice: Subject to any disclaimer, the term of this patent is extended or adjusted under 35 U.S.C. 154(b) by 30 days.

(21) Appl. No.: 14/442,049

(22) PCT Filed: Dec. 7, 2012

(86) PCT No.: PCT/EP2012/074722
§ 371 (c)(1),
(2) Date: May 11, 2015

(87) PCT Pub. No.: WO2014/086427
PCT Pub. Date: Jun. 12, 2014

(65) Prior Publication Data
US 2016/0329264 A1  Nov. 10, 2016

(51) Int. Cl.
*H01L 23/40* (2006.01)
*H01L 25/07* (2006.01)
(Continued)

(52) U.S. Cl.
CPC ...... *H01L 23/4012* (2013.01); *H01L 23/3675* (2013.01); *H01L 23/4006* (2013.01); *H01L 23/473* (2013.01); *H01L 24/72* (2013.01); *H01L 25/071* (2013.01); *H01L 25/074* (2013.01); *H01L 25/117* (2013.01); *H01L 25/16* (2013.01); *H02M 7/003* (2013.01); *H05K 7/209* (2013.01);
(Continued)

(58) Field of Classification Search
CPC ....... H01L 2224/97; H01L 2224/32145; H01L 2924/13055; H01L 25/073
See application file for complete search history.

(56) References Cited

U.S. PATENT DOCUMENTS 2,866,136 A * 12/1958 Coda ................. H05K 7/02
361/730
3,445,737 A * 5/1969 Danner ................. H01L 21/12
257/42
(Continued)

FOREIGN PATENT DOCUMENTS

DE  10 2004 018 469 B3  10/2005
DE  10 2011 075 731 A1  11/2012
(Continued)

*Primary Examiner* — Marcos D Pizarro
*Assistant Examiner* — Shannon Yi
(74) *Attorney, Agent, or Firm* — Birch, Stewart, Kolasch & Birch, LLP

(57) ABSTRACT

A semiconductor assembly includes a stack with a semiconductor module and a cooler, wherein the semiconductor module is provided in contact with the cooler. A clamping assembly is adapted to exert a force on the two sides of the stack. The stack is provided with a through hole between the two sides thereof and a part of the clamping assembly including an electrically conductive part which extends through the through hole of the stack. Thereby, a compact mechanical arrangement is provided while obtaining improved electrical properties, such as lower inductance and more even current distribution.

18 Claims, 4 Drawing Sheets

(51) Int. Cl.

| | | |
|---|---|---|
| *H01L 25/16* | (2006.01) | |
| *H02M 7/00* | (2006.01) | |
| *H05K 7/20* | (2006.01) | |
| *H01L 23/473* | (2006.01) | |
| *H01L 23/00* | (2006.01) | |
| *H01L 23/367* | (2006.01) | |
| *H01L 25/11* | (2006.01) | |

(52) U.S. Cl.
CPC .......... *H01L 2023/4031* (2013.01); *H01L 2023/4081* (2013.01); *H01L 2023/4087* (2013.01); *H01L 2924/1305* (2013.01); *H01L 2924/13055* (2013.01)

(56) References Cited

U.S. PATENT DOCUMENTS

| | | | |
|---|---|---|---|
| 4,835,427 A | 5/1989 | Böhm et al. | |
| 5,119,175 A * | 6/1992 | Long ............ | H01L 23/445 257/714 |
| 6,249,448 B1 | 6/2001 | Regnier et al. | |
| 6,259,617 B1 | 7/2001 | Wu | |
| 7,670,163 B2 | 3/2010 | Kauranen | |
| 2007/0114665 A1 | 5/2007 | Bayerer | |
| 2009/0141419 A1* | 6/2009 | Pal ............ | H01G 2/08 361/274.3 |
| 2010/0133676 A1 | 6/2010 | Sandin | |
| 2011/0181105 A1 | 7/2011 | Michinaka et al. | |
| 2012/0286914 A1* | 11/2012 | MacLennan ............ | H01F 27/10 336/60 |
| 2012/0306213 A1 | 12/2012 | Hübbers et al. | |
| 2013/0058068 A1* | 3/2013 | Funatsu ............ | H05K 7/20927 361/820 |
| 2013/0162136 A1* | 6/2013 | Baldwin ............ | H01J 1/02 313/311 |

FOREIGN PATENT DOCUMENTS

| | | |
|---|---|---|
| EP | 1 860 696 A1 | 11/2007 |
| JP | 2007-533145 A | 11/2007 |
| WO | WO 2011/086048 A1 | 7/2011 |
| WO | WO 2012/085952 A1 | 6/2012 |

\* cited by examiner

SEMICONDUCTOR ASSEMBLY HAVING A PRESS PACK STACK

TECHNICAL FIELD

The present invention relates generally to semiconductor assemblies and more particularly to a semiconductor assembly comprising a press pack module.

BACKGROUND ART

Many different types of electrical converters make use of press pack modules for their easiness to bring them into series connection with the help of a mechanical stack, where more than one module is provided in series. Press pack modules are made to be mounted in between cooler or pressure plates and pressure is applied to that stack to ensure proper electrical and thermal contact between the individual press pack modules. For HVDC converters, up to 20 modules can be put in series connection into one stack and more than a hundred stacks can be needed for the complete converter. This means that a large number of heavy and sometime expensive mechanical parts are needed to create those stacks.

An example of a prior art press pack stack is disclosed in FIG. 1. As seen in this figure, a standard stack comprises two or more rods, equally spread around the stack. Two yokes are provided, one at each end of the stack, to enclose the stack. Furthermore, a spring packet is provided on the top of the stack to provide a pressure thereon. In some press stack packs this spring packet is omitted and instead special yokes are provided which allow the use of their inherent mechanical elasticity as spring force.

Another example of a press pack stack is disclosed in the U.S. patent application publication US2010/0133676 A1.

SUMMARY

An object of the present invention is to provide a press pack stack with a simplified mechanical design.

According to the invention, there is provided a semiconductor assembly comprising a stack comprising a semiconductor module and a cooler, wherein the semiconductor module is provided in contact with the cooler, the stack having a first side and a second side; a clamping assembly being adapted to exert a force on the stack; the semiconductor assembly being characterised in that the stack is provided with a through hole between the first side and the second side and that part of the clamping assembly extends through the through hole of the stack, wherein the part of the clamping assembly extending through the through hole of the stack comprises an electrically conductive part configured to conduct electricity. Thereby, a compact mechanical arrangement is provided while obtaining improved electrical properties, such as lower inductance and more even current distribution.

In an embodiment, a single bus bar is provided. Thereby, the number of parts and thereby the weight are kept to a minimum.

In an embodiment, an insulation element is provided to electrically insulate the electrically conductive bus bar from the semiconductor module. In this way, an end portion of the stack can be contacted by means of the bus bar.

In an embodiment, the through hole is provided at the centre of the stack. This ensures even distribution of the forces exerted on the stack and reduces the mechanical parts for stacking, in turn reducing the complexity and the costs of the assembly.

In an embodiment, the semiconductor module is generally flat and has a first planar side and a second, opposite, planar side. This enables a compact design with reliable electrical and thermal connection to adjacent coolers. This is particularly advantageous when the first and second planar sides function as module power connections.

In an embodiment, the cooler is arranged such that substantially the entire area of a side of the semiconductor module (20a) is in contact with the cooler. Good electrical and thermal connections across the entire area of the semiconductor module sides are thereby ensured.

In an embodiment, the cooler is electrically conductive, so that it can be used for connecting to the semiconductor module.

In an embodiment, the semiconductor module and the cooler are circular. This provides a design with a small footprint and also improves the homogeneity of the electromagnetic coupling in the module.

In an embodiment, the clamping assembly comprises a first clamping element adapted to exert a force on the first side of the stack and a second clamping element adapted to exert a force on the second side of the stack. In this way, the semiconductor assembly can be provided as a separate part for subsequent connection to a piece of electrical equipment.

In an embodiment, the semiconductor assembly comprises a piece of electric equipment, preferably a capacitor, wherein the bus bar at a first end portion is electrically connected to the first side of the stack and at a second end portion is electrically and mechanically connected to a first pole of the piece of electric equipment. By integrating the clamping assembly into the piece of electrical equipment, a compact design is achieved and the lengths of the electrically conductive paths are kept to a minimum, improving the electrical properties of the assembly.

In an embodiment, the stack comprises a plurality of semiconductor modules and a plurality of coolers, wherein each of the semiconductor modules is provided between two of the coolers. In this way, a large number of semiconductor modules can be included in one stack.

In an embodiment, the stack comprises two semiconductor modules and three coolers, wherein a connection is preferably provided for electrical connection to a central, second cooler of the three coolers. The stack then lends itself to operating as a phase leg in an inverter, for example. In this case, the semiconductor modules comprise high voltage semiconductors, such as Isolated Gate Bipolar Transistors.

BRIEF DESCRIPTION OF DRAWINGS

The invention is now described, by way of example, with reference to the accompanying drawings, in which.

DESCRIPTION OF EMBODIMENTS

In the following, a detailed description of preferred embodiments of a semiconductor assembly according to the invention will be given.

Figure 1:
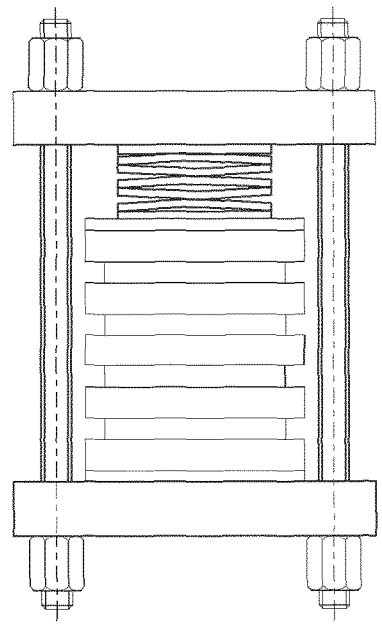
FIG. 1 shows a prior art press pack stack.

FIG. 1 has been discussed in the background art section and will not be further dealt with herein.

Figure 2:
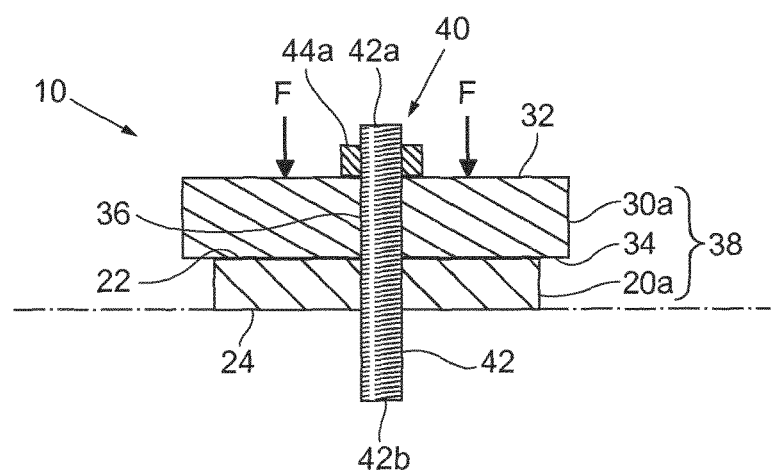
FIG. 2 shows a sectional view of a semiconductor assembly in the form of a simple press pack stack according to the invention.
Figure 3:
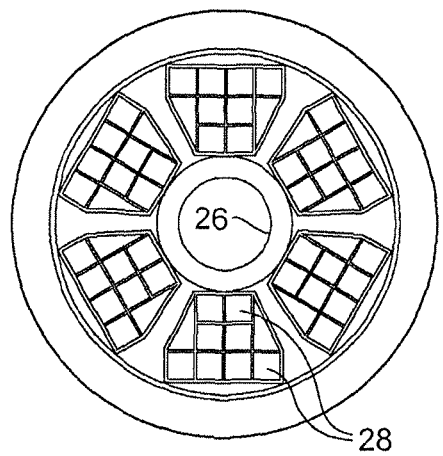
FIG. 3 shows a cross-sectional top view of a semiconductor module comprised in the semiconductor assembly of FIG. 2.

FIG. 2 shows a sectional view of a semiconductor assembly according to the invention, generally designated 10. This semiconductor assembly is a simple form of a press pack stack comprising just one semiconductor module 20a and a cooler 30a abutting each other, i.e., being in direct physical contact or engagement with each other. This semiconductor module 20a is generally flat and has a first planar side 22 and a second, opposite, planar side 24. Referring to FIG. 3, showing a cross-sectional view of the circular semiconductor module 20a, a central through hole 26 is provided in the semiconductor module between the first and second sides 22, 24. A plurality of semiconductors 28, such as Isolated Gate Bipolar Transistors (IGBTs) are provided in the module and are electrically connected to the first and second planar sides of the semiconductor module 22, 24, and these sides therefore function as module power connections.

Again referring to FIG. 2, a cooler 30a with a first planar side 32 and a second planar side 34 opposite to the first planar and abutting or engaging the first side of the semiconductor module 20a. The cooler 30a is provided with a central through hole 36 between the opposite planar sides, which hole is aligned with the through hole 26 of the semiconductor module 20a. The cooler has good electrical and thermal conductivity and it is thus preferred that the cooler is made of a material with good electrical conductivity, such as copper or aluminium, and that channels for coolant (not shown), such as water, are provided inside the cooler. The cooler 30a is circular with a diameter equal to or exceeding the diameter of the semiconductor module 20a, in order to ensure electrical and thermal conduction between the semiconductor module 20a and the cooler across 30a the entire first side 22 of the semiconductor module 20a.

The semiconductor module 20a and the cooler 30a together form a stack, generally designated 38.

A clamping assembly, generally designated 40, is adapted to exert a force F on the stack 38, in this case on the first side 32 of cooler 30a in the direction towards the semiconductor module 20a, whereby the cooler 30a acts as a yoke. Thus, the clamping assembly 40 extends through the through hole 26 of the semiconductor module 20a and the through hole 36 of the cooler 30a. The part extending through the through holes 26, 36 is an electrically conductive bus bar 42, which has a first, threaded, end portion 42a, on which a clamping element in the form of a nut 44a is threaded, and a second end portion 42b opposite to the first end portion 42a. The electrically conductive bus bar may be an aluminium rod or alternatively a central steel rod provided with a jacket of aluminium. Although this embodiment comprises an electrically conductive part in the form of a bus bar, the electrically conductive part extending through the through hole may be embodied in many different forms, such as a bar or a strip, which conducts electricity within an inverter, a substation, a battery bank or any other electrical apparatus.

It is assumed that the semiconductor module 20a rests with its second side 24 on a fixed plane, shown with dashed line in the figure. This fixed plane may be another cooler, an additional yoke, or the surface of a piece of electric equipment, as will be described below. Thus, when the nut 44a is tightened, a downward directed force F will be exerted on the yoke or cooler 30a. Since the yoke or cooler 30a is rigid, this force will be transmitted onto the semiconductor module 20a. Since the semiconductor module 20a cannot give way due to the fixed plane on which the second side 24 thereof abuts, the semiconductor module 20a and the cooler 30a will be pressed into tight contact with each other, ensuring good electric and thermal conductivity there between.

A second embodiment of a semiconductor assembly will now be described with reference to FIG. 4. In this embodiment, a plurality, namely four semiconductor modules 20a, 20b, 20c, 20d, are provided in a stack. Correspondingly, a plurality of coolers, namely five coolers 30a, 30b, 30c, 30d, 30e, are provided in such a way that each of the semiconductor modules 20a-d is provided between two of the coolers 30a-e. This means that the semiconductor modules 20a-d and the coolers 30a-e are arranged alternately in a stack 38 having a first upper end as shown in the figure and a second, opposite lower end.

A clamping assembly 40 comprises a bar 42 with a first upper threaded end portion 42a and a second lower threaded end portion 42b. A first clamping element in the form of a first nut 44a is threaded onto the first end portion 42a of the bar and a second clamping element in the form of a second nut 44b is threaded onto the second end portion 42b of the bar.

A spring package 46 is arranged between the first nut 44a and the first, uppermost cooler 30a, as shown in the figure. The spring package is shown as a being built up from a plurality of cup springs but it will be realized that other forms of springs may be provided.

A first yoke insulation element 48a is provided between the spring package 46 and the first cooler 30a so as to provide electrical insulation there between. Correspondingly, a second yoke insulation element is provided between the second nut 44b and the lowermost cooler 30e so as to provide electrical insulation there between.

Connections (not shown in the figure) are provided for electrical connection to the semiconductor modules 20a-d and optionally to one or more of the coolers 30a-e.

The semiconductor assembly 10 is in this embodiment held together by means of the clamping assembly 40, without relying on any fixed plane as in the embodiment shown in FIG. 2. This means that this semiconductor assembly may be releasably mounted to a piece of electrical equipment, such as a capacitor or a transformer.

Figure 5:
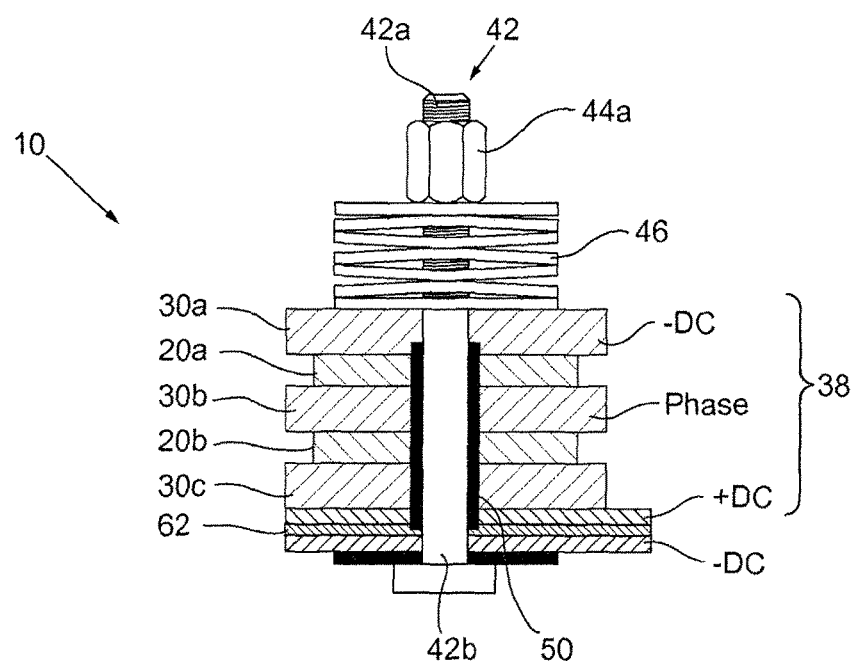
FIG. 5 shows a side view, partially in section, of a third embodiment of a semiconductor assembly in the form of a press pack stack according to the invention.

A third embodiment of a semiconductor assembly will now be described with reference to FIG. 5. In this embodiment, a plurality, namely two semiconductor modules 20a, 20b, are provided in a stack 38. Correspondingly, a plurality of coolers, namely three coolers 30a, 30b, 30c, are provided in such a way, that each of the semiconductor modules 20a, 20b is provided between two of the coolers 30a-c. This means that also in this embodiment the semiconductor modules 20a, 20b, and the coolers 30a-c are arranged alternately in a stack 38 having a first upper end as shown in the figure and a second, opposite lower end.

A clamping assembly 40 comprises a bar 42 with an upper threaded end portion 42a. The lower end portion 42b of the bar 42 is attached to a piece of electrical equipment, such as a capacitor. A clamping element in the form of a nut 44a is threaded onto the upper end portion 42a of the bar.

Figure 4:
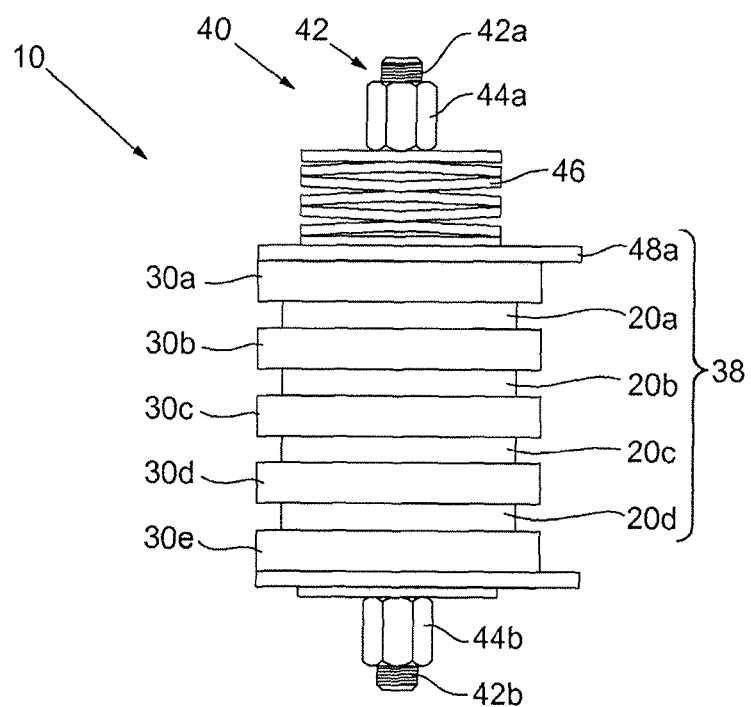
FIG. 4 shows a side view of a second embodiment of a semiconductor assembly in the form of a press pack stack according to the invention.

A spring package 46, similar to the one shown in FIG. 4, is arranged between the first nut 44a and the first, uppermost cooler 30a, as shown in the figure. The spring package 46 exerts a force directly on the first, uppermost cooler 30a, which in this embodiment functions as a yoke. The yoke insulating elements shown in FIG. 4 are in this embodiment omitted.

In this embodiment, where the stack of coolers and semiconductor modules is shown in section, an insulation element 50 is provided to electrically insulate the central bar 42 from the semiconductor modules 20a, 20b. The insulation element 50 also electrically insulates a negative DC connection or terminal "−DC" and a positive DC connection or terminal "+DC" from each other. However, the insulation element 50 does not extend all the way up to the spring package 46 which means that the first, uppermost cooler 30a is in electrical connection with the bar 42. This means that since the bar 42, in this case acting as a bus bar and being in electrical connection with the negative DC connection, is in direct electrical connection with the first, uppermost cooler 30a, also this first cooler will take the same electrical potential, i.e., "−DC".

An electrically insulating means 62 is provided between the negative DC connection or terminal "−DC" and the positive DC connection or terminal "+DC" to electrically separate these from each other.

Connections in the form of the uppermost and lowermost coolers 30a, 30c are provided for electrical connection to the semiconductor modules 20a, 20b.

A phase connection is provided for electrical connection to the central, second cooler 30b, which, being electrically insulated from the bus bar 42, takes the electrical potential "−DC" or "+DC", in dependence of the operation of the semiconductor modules 20a, 20b. In this embodiment, the semiconductor assembly 10 is therefore suitable for providing the phase voltage of a converter, such as an HVDC converter.

Figure 6:
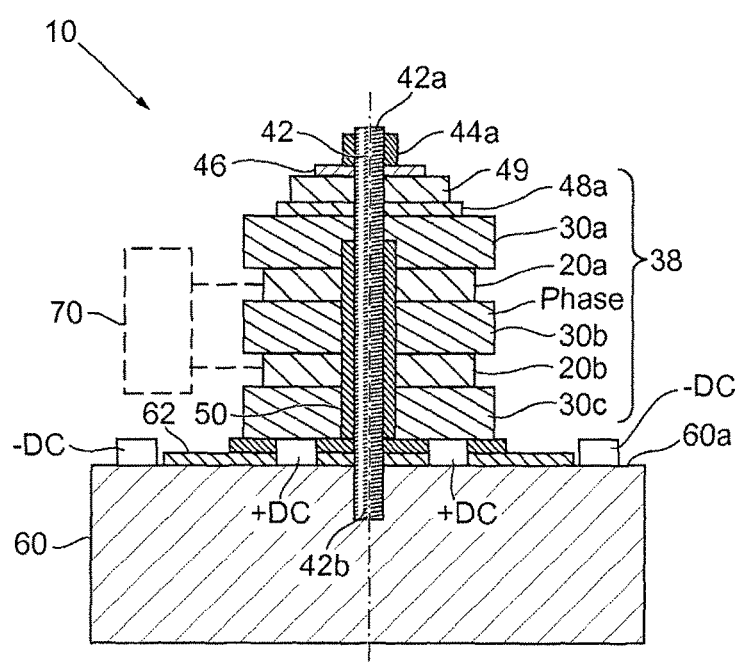
FIG. 6 shows a sectional view of a fourth embodiment of a semiconductor assembly in the form of a press pack stack according to the invention mounted to a piece of electrical equipment in the form of a capacitor.

A fourth embodiment of a semiconductor assembly will now be described with reference to FIGS. 6-8. In this embodiment, a plurality, namely two semiconductor modules 20a, 20b are provided in a stack 38. Correspondingly, a plurality of coolers, namely three coolers 30a, 30b, 30c are provided in such a way, that each of the semiconductor modules 20a, 20b is provided between two of the coolers 30a-c. This means that also in this embodiment the semiconductor modules 20a, 20b and the coolers 30a-c are arranged alternately in a stack 38 having a first upper end as shown in the figure and a second, opposite lower end.

A clamping assembly 40 comprises a bar 42 with an upper threaded end portion 42a. A clamping element in the form of a nut 44a is threaded onto the upper end portion 42a of the bar 42, acting as a bus bar. The lower end portion 42b of the bar 42 is attached to a piece of electrical equipment in the form of a capacitor 60, preferably by means of a screw joint, wherein the capacitor is provided with a screw thread electrically connected to one of the electrical connections.

A spring package 46 in the form of a cup spring is arranged between the nut 44a and the first, uppermost cooler 30a, as shown in the figure. The spring package 46 exerts a force on the first, uppermost cooler 30a through a dedicated yoke 49, i.e., a yoke not functioning as a cooler, and a yoke insulation element 48a.

The bus bar 42 is provided with a bus bar insulation 50 to electrically insulate the bus bar 42 from the semiconductor modules 20a, 20b.

The design of the capacitor 60 will now be discussed. The front side 60a of the capacitor casing exhibits a plurality of terminals or poles, a first set labelled "−DC" and referring to a first pole of the capacitor, and a second set labelled "+DC" and referring to a second pole of the capacitor. The first set of terminals is usually at the same electrical potential as the casing of the capacitor 60.

Figure 7:
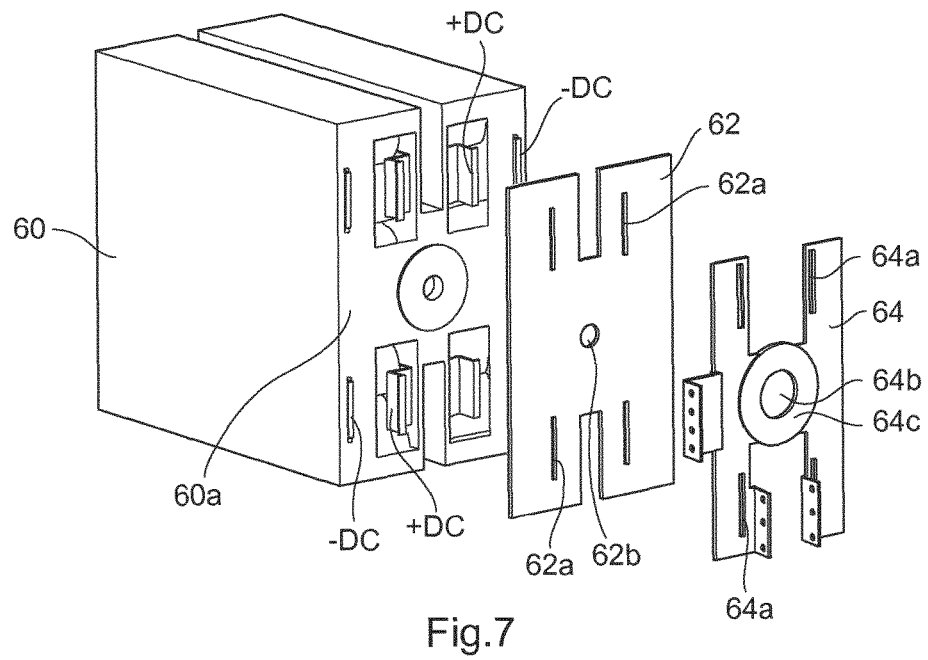
FIG. 7 shows an exploded perspective view of the capacitor of FIG. 6.
Figure 8:
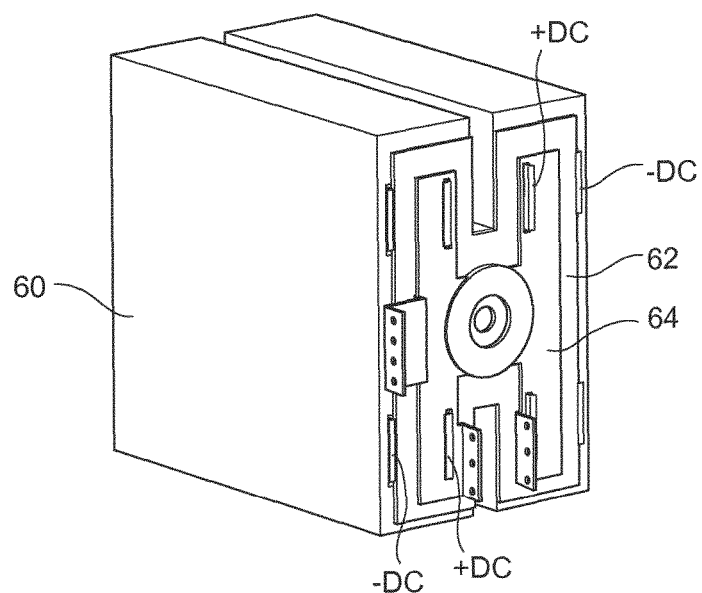
FIG. 8 shows the capacitor of FIG. 7 after assembly.

An insulating sheet in the form of a lamination 62, see particularly FIGS. 7 and 8, is provided on the front side 60a of the capacitor 60 and has a size which almost covers this front side 60a. First openings 62a are provided in the lamination 62 for the second set of terminals "+DC" and a second, central opening 62b is provided for the bus bar 42. The lamination 62 is made of an electrically insulating material.

In front of, i.e., outside of the lamination 62, there is provided a conductive sheet 64 of electrically conductive material, such as sheet metal. First openings 64a are provided in the conductive sheet 64 for the second set of terminals "+DC" and a second, central opening 64b is provided for the bus bar 42. However, the diameter of the central opening 64b of the conductive sheet is substantially larger than the diameter of the bus bar 42 to ensure electrical insulation there between. The conductive sheet 64 is provided with a circular area 64c around the central opening 64b which is adapted for tight contact with the innermost cooler 30c.

During assembly, the lamination 62 is fitted onto the second set of terminals "+DC" and the conductive sheet 64 is then also fitted onto this second set of terminals. Electrical and mechanical connection between the second set of terminals "+DC" and the conductive sheet 64 is provided by means of soldering, brazing or bolting etc. The bus bar 42 is then screwed or otherwise attached to the capacitor 60, providing the potential "−DC" to the bus bar 42. The different parts shown in FIG. 4 are then threaded onto the bus bar 42 in the order innermost to outermost as shown in FIG. 4, ending with the nut 44a, which is screwed onto the threaded outer end portion 42a of the bus bar 42 until a desired force is exerted on the stack of coolers and semiconductor modules or by applying a force, such as a hydraulic force, and turning the nut to lock the spring.

Connections are provided for electrical connection between a control unit 70 and the semiconductor modules 20a, 20b.

A phase connection is provided for electrical connection to the central, second cooler 30b, which, being electrically insulated from the bus bar 42, takes the electrical potential "−DC" or "+DC", in dependence of the operation of the semiconductor modules 20a, 20b. In this embodiment, the semiconductor assembly 10 is therefore suitable for providing the phase voltage of a converter, such as an HVDC converter.

Preferred embodiments of a semiconductor assembly have been described. It will be appreciated that these made be modified within the scope defined by the appended claims without departing from the inventive idea.

A piece of electrical equipment, such as a capacitor, has been described with an insulating sheet in the form of a lamination. It will be appreciated that this idea is applicable not only to the inventive semiconductor assembly described herein, but also to other assemblies, such as an assembly comprising the prior art press pack stack shown in FIG. 1.

Although specific polarities have been set out in the drawings, it will be realized that any voltages and currents can be applied to the semiconductor assembly without departing from the inventive idea.

In the described preferred embodiments, the semiconductor modules and the coolers are circular. It will be appreciated that the shape of these parts may vary from circular, such as square or hexagonal, without departing from the inventive idea.

The lamination has been described and shown as being fitted onto the second set of terminals. In other embodiments, the lamination may be fitted inside or outside of the housing of the piece of electrical equipment.

The central opening provided the conductive sheet for the bus bar has been described as being is substantially larger than the diameter of the bus bar itself in order to achieve electrical insulation. This insulation can also be achieved by other means, such as by sealing, for example with electrically insulating glue.

The invention claimed is:

1. A semiconductor assembly comprising:
    a stack comprising a semiconductor module and a cooler, wherein the semiconductor module is provided in contact with the cooler, the stack having a first side and a second side; and
    a clamping assembly being adapted to exert a force on the stack,
    wherein the stack is provided with a through hole between the first side and the second side and wherein part of the clamping assembly extends through the through hole of the stack,
    wherein the part of the clamping assembly extending through the through hole of the stack comprises an electrically conductive part in the form of a bus bar configured to conduct electricity, and
    wherein the semiconductor assembly further comprises
        a piece of electric equipment, wherein the electrically conductive part at a first end portion is electrically connected to the first side of the stack and at a second end portion is electrically and mechanically connected to a first pole of the piece of electric equipment; and
        an insulation element electrically insulating the electrically conductive part from the semiconductor module.

2. The semiconductor assembly according to claim 1, wherein the clamping assembly extending through the through hole of the stack comprises a single bus bar.

3. The semiconductor assembly according to claim 1, wherein the through hole is provided at the centre of the stack.

4. The semiconductor assembly according to claim 1, wherein the semiconductor module is generally flat and has a first planar side and a second, opposite, planar side.

5. The semiconductor assembly according to claim 1, wherein the cooler is arranged such that substantially the entire area of a side of the semiconductor module is in contact with the cooler.

6. The semiconductor assembly according to claim 1, wherein the cooler is electrically conductive.

7. The semiconductor assembly according to claim 1, wherein the semiconductor module and the cooler are circular.

8. The semiconductor assembly according to claim 1, wherein the clamping assembly comprises a first clamping element adapted to exert a force on the first side of the stack and a second clamping element adapted to exert a force on the second side of the stack.

9. The semiconductor assembly according to claim 1, wherein the piece of electric equipment is a capacitor.

10. The semiconductor assembly according to claim 1, wherein the stack comprises a plurality of semiconductor modules and a plurality of coolers, wherein each of the semiconductor modules is provided between two of the coolers.

11. The semiconductor assembly according to claim 1, wherein the clamping assembly comprises a spring package at a first end portion of the clamping assembly.

12. The semiconductor assembly according to claim 1, wherein the semiconductor module comprises high voltage semiconductors.

13. The semiconductor assembly according to claim 4, wherein the first and second planar sides of the semiconductor module function as module power connections.

14. The semiconductor assembly according to claim 10, wherein the stack comprises two semiconductor modules and three coolers.

15. The semiconductor assembly according to claim 12, wherein the semiconductor module comprises Isolated Gate Bipolar Transistors.

16. The semiconductor assembly according to claim 14, comprising a connection provided for electrical connection to a central, second cooler of the three coolers.

17. The semiconductor assembly according to claim 16, wherein said connection is a phase connection of an HVDC converter and wherein the second cooler is electrically insulated from the electrical conductive part.

18. The semiconductor assembly according to claim 17, wherein the electrical conductive part acting as a bus bar is in electrical connection with a DC terminal and wherein a first cooler is in electrical connection with the electrical conductive part acting as a bus bar.

* * * * *